(12) United States Patent
Kwag et al.

(10) Patent No.: US 11,251,222 B2
(45) Date of Patent: Feb. 15, 2022

(54) TECHNIQUE OF GENERATING A MICRO LIGHT EMITTING DIODE MODULE USING A PLURALITY OF MICRO LEDS HAVING SIMILAR CHARACTERISTICS

(71) Applicant: SAMSUNG ELECTRONICS CO., LTD., Suwon-si (KR)

(72) Inventors: Doyoung Kwag, Suwon-si (KR);
Eunhye Kim, Suwon-si (KR);
Sangmoo Park, Suwon-si (KR);
Minsub Oh, Suwon-si (KR); Yoonsuk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 276 days.

(21) Appl. No.: 16/426,846

(22) Filed: May 30, 2019

(65) Prior Publication Data
US 2020/0020740 A1 Jan. 16, 2020

(30) Foreign Application Priority Data

Jul. 10, 2018 (KR) .................. 10-2018-0079775

(51) Int. Cl.
*H01L 27/15* (2006.01)
*H01L 33/00* (2010.01)
(Continued)

(52) U.S. Cl.
CPC ....... *H01L 27/153* (2013.01); *G01N 21/9501* (2013.01); *H01L 22/12* (2013.01); *H01L 33/005* (2013.01); *G01N 2021/177* (2013.01)

(58) Field of Classification Search
CPC . H01L 25/0753; H01L 27/153; H01L 33/005; H01L 22/12; H01L 33/0095;
(Continued)

(56) References Cited

U.S. PATENT DOCUMENTS 8,646,505 B2   2/2014   Bibl et al.
8,952,717 B2   2/2015   Ryu
(Continued)

FOREIGN PATENT DOCUMENTS

EP   2439517 A1   4/2012
JP   2012-518182 A   8/2012
(Continued)

OTHER PUBLICATIONS

International Search Report (PCT/ISA/210), issued by International Searching Authority in corresponding International Application No. PCT/KR2019/006497, dated Sep. 17, 2019.
(Continued)

*Primary Examiner* — Ermias T Woldegeorgis
(74) *Attorney, Agent, or Firm* — Sughrue Mion, PLLC

(57) ABSTRACT

An electronic apparatus is provided. The electronic apparatus includes a substrate including a plurality of electrodes in contact with at least part of electrodes of a plurality of micro LEDs disposed on a transparent substrate at a first pitch to apply a current to micro LEDs of the plurality of micro LEDs disposed at a second pitch, a camera disposed opposite to the substrate based on the transparent substrate, and a processor configured to apply a current to the plurality of electrodes on the substrate, control the camera to capture an image of the plurality of LEDs including a light emitting micro LED according to current applying, obtain characteristic information of the light emitting micro LED based on the captured image, and determine a target substrate on which each of the plurality of micro LEDs is disposed based on the obtained characteristic information.

20 Claims, 12 Drawing Sheets

(51) Int. Cl.
  *H01L 21/66* (2006.01)
  *G01N 21/95* (2006.01)
  *G01N 21/17* (2006.01)

(58) Field of Classification Search
  CPC .......... G01N 21/9501; G01N 2021/177; G01J 3/505; G01J 3/506; G01J 3/50; G01J 2001/4252
  See application file for complete search history.

(56) References Cited

U.S. PATENT DOCUMENTS

| | | | |
|---|---|---|---|
| 2004/0080938 A1* | 4/2004 | Holman | G02F 1/133605 362/231 |
| 2010/0320488 A1* | 12/2010 | Horie | H01L 27/153 257/91 |
| 2015/0318328 A1 | 11/2015 | Bibl et al. | |
| 2017/0263811 A1* | 9/2017 | Zou | H01L 24/81 |
| 2017/0278734 A1* | 9/2017 | Zou | H01L 24/95 |
| 2017/0345692 A1 | 11/2017 | Liu et al. | |
| 2018/0076076 A1 | 3/2018 | Bathurst et al. | |
| 2018/0096977 A1 | 4/2018 | Ahmed et al. | |
| 2018/0174931 A1 | 6/2018 | Henley | |

FOREIGN PATENT DOCUMENTS

| | | |
|---|---|---|
| JP | 5887505 B2 | 3/2016 |
| KR | 10-1310359 B1 | 9/2013 |
| KR | 10-1593643 B1 | 2/2016 |
| KR | 10-2017-0101667 A | 9/2017 |
| TW | 201137323 A | 11/2011 |

OTHER PUBLICATIONS

Written Opinion (PCT/ISA/237) issued by the International Searching Authority in corresponding International Application No. PCT/KR2019/006497, dated Sep. 17, 2019.

Communication dated Aug. 18, 2021 issued by the European Patent Office in application No. 19833353.6.

* cited by examiner

FIG. 10
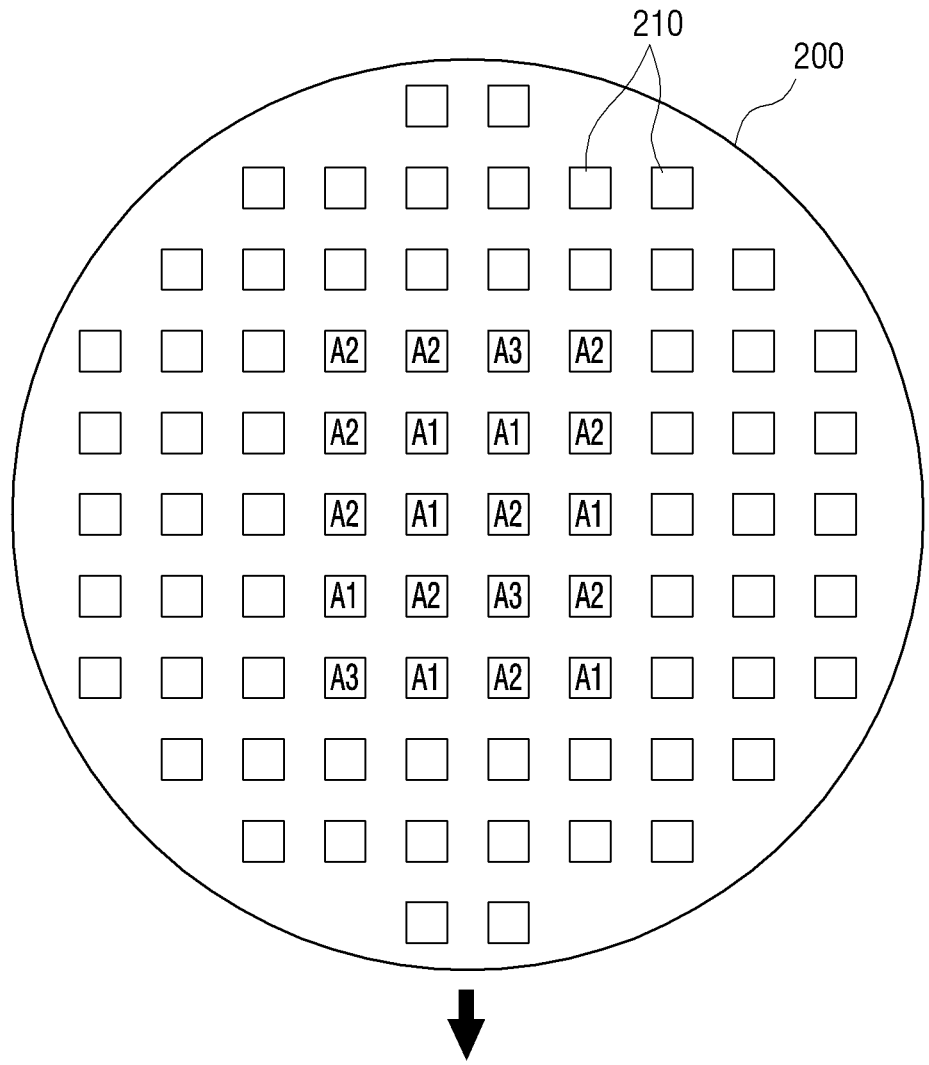
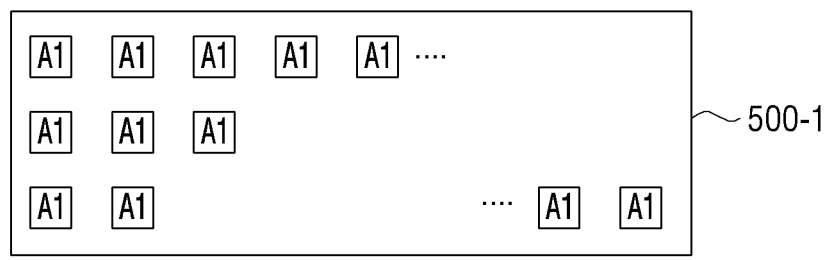
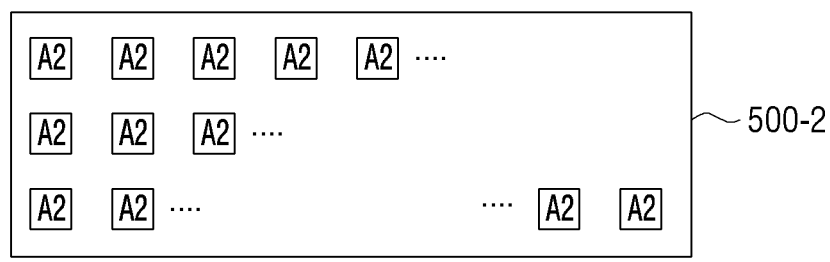

TECHNIQUE OF GENERATING A MICRO LIGHT EMITTING DIODE MODULE USING A PLURALITY OF MICRO LEDS HAVING SIMILAR CHARACTERISTICS

CROSS-REFERENCE TO RELATED APPLICATIONS

This application claims priority from Korean Patent Application No. 10-2018-0079775, filed on Jul. 10, 2018, in the Korean Intellectual Property Office, the disclosure of which is incorporated herein by reference in its entirety.

BACKGROUND

1. Field

Devices and methods consistent with what is disclosed herein relate to a micro LED module manufacturing method and a computer readable recording medium, and more particularly, to an electronic apparatus for manufacturing a micro LED module using micro LEDs having similar characteristic, a micro LED module manufacturing method, and a computer-readable recording medium.

2. Description of the Related Art

A semiconductor light emitting diode (LED) has been widely used for various display devices of a variety of electronic apparatuses such as a TV, a mobile phone, a PC, a laptop, a PDA, etc. as well as a light source for a lightening equipment.

Recently, a micro LED of less than 100 µm has been developed, and has more rapid response speed, lower power consumption, and high luminance compared to an existing LED. Thus, the micro LED draws attention as a light emitting device of a next generation display.

The micro LED may be manufactured in the form of a semiconductor chip on a wafer, and disposed on a target substrate to constitute a light emitting module of a display.

However, the semiconductor chip on the wafer has a different hue, luminance, etc. due to its manufacturing tolerance, resulting in a difference in performance between areas of the semiconductor chip on the wafer.

As the semiconductor chip on the wafer is disposed on a target substrate in a state in which the performances between areas of the semiconductor chip on the wafer are different, performances between semiconductor chips on the target substrate may be different.

The difference in performance between areas of the semiconductor on the target substrate is accompanied by a problem that the luminance or hue of the manufactured display is not uniform.

Accordingly, there arises a demand for a technique of generating a micro LED module using micro LEDs having similar characteristic among a plurality of micro LEDs generated on the wafer.

SUMMARY

An aspect of the embodiments relates to providing an electronic apparatus for analyzing characteristic of a micro LED and manufacturing an LED module having a uniform hue and luminance based on characteristic information, a micro LED module manufacturing method, and a computer-readable recording medium.

According to an embodiment, there is provided an electronic apparatus including a substrate including a plurality of electrodes in contact with at least part of electrodes of a plurality of micro LEDs disposed on a transparent substrate at a first pitch to apply a current to micro LEDs of the plurality of micro LEDs disposed at a second pitch, a camera disposed opposite to the substrate based on the transparent substrate, and a processor configured to apply a current to the plurality of electrodes on the substrate, control the camera to capture an image of the plurality of LEDs including a micro LED which emits the current applying, obtain characteristic information of the light-emitting micro LED based on the captured image, and determine a target substrate on which each of the plurality of micro LEDs is disposed based on the obtained characteristic information.

The electronic apparatus may further include a first driver configured to move the substrate, and the processor is further configured to move the substrate by the first pitch by controlling the first driver to apply a current to a micro LED adjacent to the light-emitting micro LED after capturing the image of the plurality of LEDs including the light-emitting micro LED.

The electronic apparatus may further include a second driver configured to arrange each of the plurality of micro LEDs on the determined target substrate, and the characteristic information includes at least one of a luminance value, a color coordinate value, and a performance grade of the light-emitting micro LED, and the processor is further configured to control the second driver to arrange a micro LED having a characteristic information value of a first range on a first target plate, and a micro LED having a characteristic information value of a second range that is different from the first range on a second target plate.

The first pitch may be the same as the second pitch.

The plurality of electrodes may be disposed on the substrate at the second pitch, the second pitch may be a multiple of the first pitch, and the processor is further configured to apply a current through the plurality of electrodes at the second pitch.

The electronic apparatus may further include a memory, and the processor is further configured to match position information with characteristic information of the light-emitting micro LED and store the matched information in the memory.

The electronic apparatus may further include a laser device, and a third driver configured to arrange a mask, and the processor is further configured to control the third driver to arrange a mask including a plurality of holes on an opposite surface to a surface of the transparent substrate on which the plurality of micro LEDs are disposed, based on the obtained characteristic information, and control the laser device to arrange a micro LED arranged in an area of the plurality of holes on the target substrate by irradiating laser onto the mask.

The second pitch may be in proportion to resolving power of the camera.

A size of each micro LED of the plurality of micro LEDs may be between 30 µm and 100 µm.

The second pitch may be between 100 µm and 200 µm.

According to an embodiment, there is provided a method for manufacturing a micro LED module, the method including preparing a transparent substrate on which a plurality of micro LEDs are arranged at a first pitch, making a plurality of electrodes disposed on a substrate be in contact with at least part of electrodes of the plurality of micro LEDs, applying a current to micro LEDs of the plurality of micro LEDs disposed at a second pitch through the plurality of electrodes on the substrate, capturing an image of the plurality of micro LEDs, obtaining characteristic information of a micro LED which emits light by the current applying based on the captured image, and manufacturing a micro LED module by respectively arranging the plurality of micro LEDs on a plurality of target substrates based on the obtained characteristic information.

The method may further include moving the transparent substrate or the substrate by the first pitch to apply a current to a micro LED adjacent to the light-emitting micro LED after capturing the image of the plurality of micro LEDs including the light-emitting micro LED.

The characteristic information may include at least one of a luminance value, a color coordinate value, or a performance grade of the light-emitting micro LED, and the manufacturing of the micro LED module may include arranging a micro LED having a characteristic information value of a first range on a first target substrate, and a micro LED having a characteristic information value of a second range that is different from the first range on a second target substrate.

The first pitch may be the same as the second pitch.

The plurality of electrodes may be disposed on the substrate at the second pitch, the second pitch may be a multiple of the first pitch, and the applying of the current may include applying a current through the plurality of electrodes disposed at the second pitch.

The method may further include matching position information with characteristic information of the light-emitting micro LED and storing the matched information.

The manufacturing of the micro LED module may include arranging a mask including a plurality of holes on an opposite surface to a surface of the transparent substrate on which the plurality of micro LEDs are disposed, based on the obtained characteristic information, and irradiating laser onto the mask to arrange a micro LED disposed in an area of the plurality of holes on the target substrate.

A size of each micro LED of the plurality of micro LEDs may be between 30 μm to 100 μm.

The second pitch may be between 100 μm to 200 μm.

According to an embodiment, there is provided a computer-readable recording medium including a program for executing a manufacturing method of a micro LED module, wherein the manufacturing of the micro LED module includes transmitting a control signal to a first driver for moving a substrate to make a plurality of electrodes disposed on the substrate be in contact with at least part of electrodes of a plurality of micro LEDs disposed on a transparent substrate at a first pitch, applying a current to micro LEDs of the plurality of micro LEDs disposed at a second pitch through the plurality of electrodes on the substrate, transmitting a control signal to a camera to capture an image of the plurality of micro LEDs, obtaining characteristic information of a micro LED which emits light by the current applying based on the image captured by the camera, and transmitting a control signal to a second driver for arranging the plurality of micro LEDs on a plurality of target substrates based on the obtained characteristic information.

BRIEF DESCRIPTION OF THE DRAWINGS

FIG. 10 is a view to explain an example for manufacturing a micro LED module using characteristic information of a micro LED.

DETAILED DESCRIPTION

Figure 1:
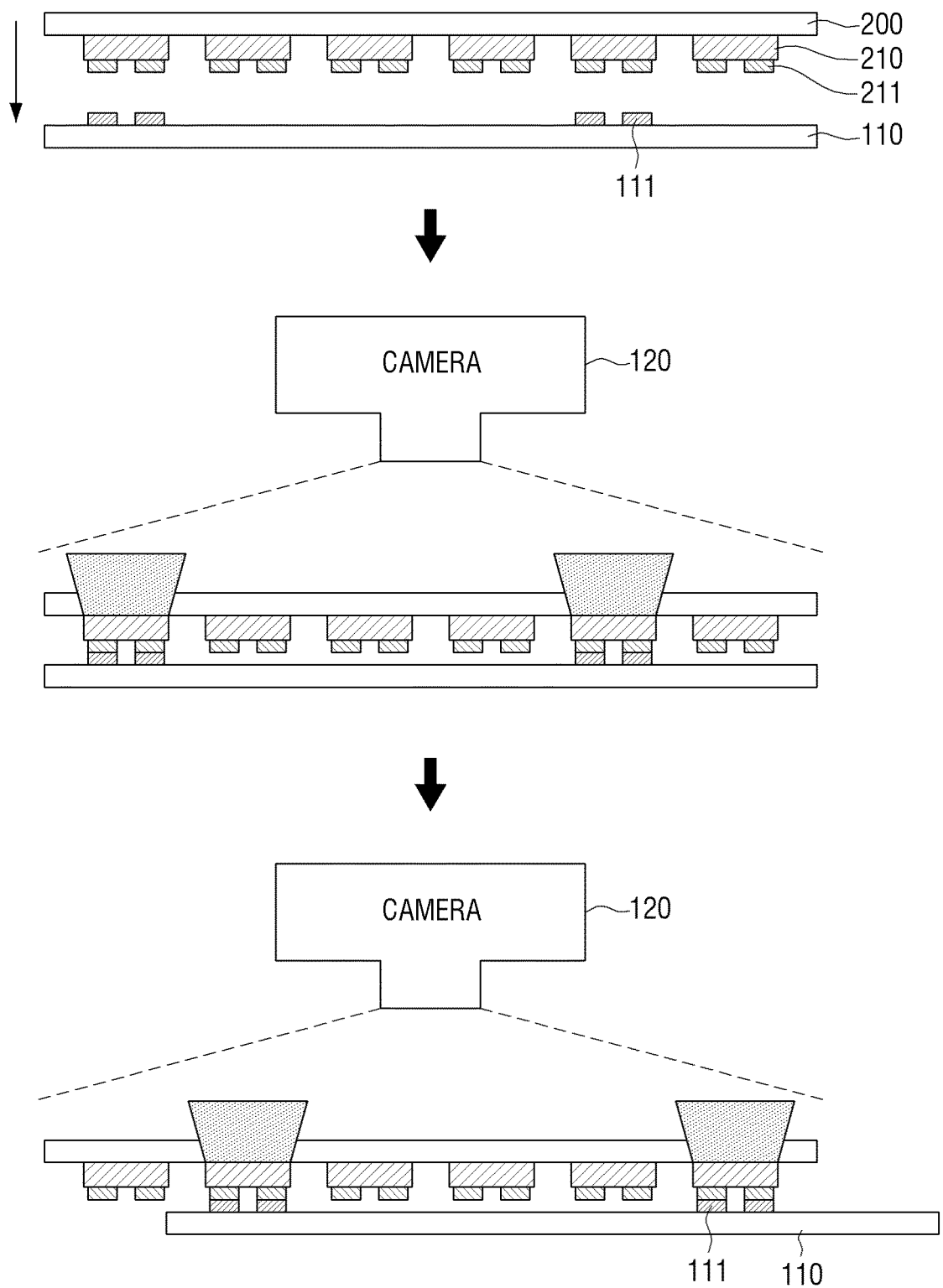
FIG. 1 is a view to explain an operation of a micro LED of an electronic apparatus according to an embodiment of the disclosure.

The terms used in this specification will be briefly described, and the disclosure will be described in detail.

All the terms used in this specification including technical and scientific terms have the same meanings as would be generally understood by those skilled in the related art. However, these terms may vary depending on the intentions of the person skilled in the art, legal or technical interpretation, and the emergence of new technologies. In addition, some terms are arbitrarily selected by the applicant. These terms may be construed in the meaning defined herein and, unless otherwise specified, may be construed on the basis of the entire contents of this specification and common technical knowledge in the art.

The invention is not limited to an embodiment disclosed below and may be implemented in various forms and the scope of the invention is not limited to the following embodiments. In addition, all changes or modifications derived from the meaning and scope of the claims and their equivalents should be construed as being included within the scope of the disclosure. In the following description, the configuration which is publicly known but irrelevant to the gist of the disclosure could be omitted.

The terms such as "first," "second," and so on may be used to describe a variety of elements, but the elements should not be limited by these terms. The terms are used simply to distinguish one element from other elements.

The singular expression also includes the plural meaning as long as it does not differently mean in the context. In this specification, terms such as 'include' and 'have/has' should be construed as designating that there are such features, numbers, operations, elements, components or a combination thereof in the specification, not to exclude the existence or possibility of adding one or more of other features, numbers, operations, elements, components or a combination thereof.

In an embodiment, 'a module', 'a unit', or 'a part' perform at least one function or operation, and may be realized as hardware, such as a processor or integrated circuit, software that is executed by a processor, or a combination thereof. In addition, a plurality of 'modules', a plurality of 'units', or a plurality of 'parts' may be integrated into at least one module or chip and may be realized as at least one processor except for 'modules', 'units' or 'parts' that should be realized in a specific hardware.

Hereinafter, embodiments of the disclosure will be described in detail with reference to the accompanying drawings so that those skilled in the art can easily carry out the invention. However, the disclosure may be embodied in many different forms and is not limited to the embodiments described herein. In order to clearly illustrate the disclosure in the drawings, some of the elements that are not essential to the complete understanding of the disclosure are omitted for clarity, and like reference numerals refer to like elements throughout the specification.

Hereinafter, the disclosure will be describe in greater detailed with reference to drawings.

FIG. 1 is a view to explain an operation of a micro LED of an electronic apparatus according to an embodiment of the disclosure.

Referring to FIG. 1, an electronic apparatus may include a substrate 110. The substrate 110 may include a plurality of electrodes 111 for providing electrodes to a plurality of micro LEDs 210 disposed on a transparent substrate 200. The micro LED 210 may be less than 100 μm. The micro LED 210 may be between 30 μm and 100 μm. For ease of explanation, in this specification, it is illustrated that the micro LED 210 is in a flip-chip form, but is not limited thereto. However, the disclosure is not limited thereto, but any form of micro LED may be possible if electrodes are disposed on one side such as a lateral form, etc.

The transparent substrate 200 may be a wafer in which the plurality of micro LEDs 210 are formed. In addition, the transparent substrate 200 may be a relay substrate on which the plurality of micro LEDs 210 are moved. For example, the transparent substrate 200 may be a sapphire substrate or a quartz substrate, but not limited thereto, and any type of transparent substrate may all be used.

The electronic apparatus may make electrodes 211 of the plurality of micro LEDs 210 be in contact with the electrodes 111 disposed on the substrate 110. The electronic apparatus may align the positions of the electrodes 211 of the plurality of micro LEDs 210 and the electrodes 111 disposed on the substrate 110 before the contact. The electronic apparatus 100 may align the positions of the electrodes 211 of the plurality of micro LEDs 210 and the electrodes 111 disposed on the substrate 110 by controlling X-axis, Y-axis, Z-axis, and an angle (θ). The plurality of micro LEDs 210 may be disposed on the transparent substrate 200 at a first pitch, and the electrodes 211 of the substrate 110 may be disposed at a second pitch that is a multiple of the first pitch. A pitch may refer to an interval between one micro LED and another micro LED adjacent thereto, and may be a spacing between one point of the micro LED and the corresponding point of the adjacent micro LED. For example, the distance between the center point of the micro LED and the center point of the adjacent micro LED may be defined as the first pitch. The pitch will be described in detail with reference to FIG. 4.

The electronic apparatus may make the electrodes 211 of the plurality of LEDs 210 be in contact with the electrodes 111 disposed on the substrate 110 by moving at least one of the substrate 100 or the transparent substrate 200. Referring to FIG. 1, it is illustrated that the electrodes 111 of the substrate 110 are in contact with the electrodes 211 of the micro LEDs 210 by moving the transparent substrate 200 downwardly, but the substrate 100 may be moved upwardly, or the transparent substrate 200 and the substrate 110 both may move.

FIG. 1 illustrates that the transparent substrate 200 is disposed above the substrate 110, and the substrate 110 is disposed under the transparent substrate 200, but in the implementation, the transparent substrate 200 may be disposed under the substrate 100, and the substrate 110 may be disposed above the transparent substrate 200. In this case, the electrodes 211 of the micro LEDs 210 and the electrodes 111 of the substrate 110 may be disposed to face each other.

When the electrodes 211 of the micro LEDs 210 are in contact with the electrodes 111 of the substrate 110, the electronic apparatus may apply a current to the electrodes 111 of the substrate 110. Accordingly, a micro LED in contact with the electrodes 111 of the substrate 110 may emit light.

While the micro LED contacting the electrodes 111 of the substrate 110 emits light, the electronic apparatus may control a camera 120 to capture an image of the entirety of the plurality of micro LEDs including the emitting micro LED. In addition, the electronic apparatus may analyze the captured image, and analyze the characteristic information of the emitting micro LED.

After capturing, the electronic apparatus may move the substrate 110 or the transparent substrate 200 by the first pitch for measuring a micro LED adjacent to the emitting micro LED. FIG. 1 illustrates that the substrate 110 moves, but in the implementation, the transparent substrate 200 may move.

As described above, an absolute characteristic value of each of the micro LEDs may be obtained according to an embodiment.

Figure 2:
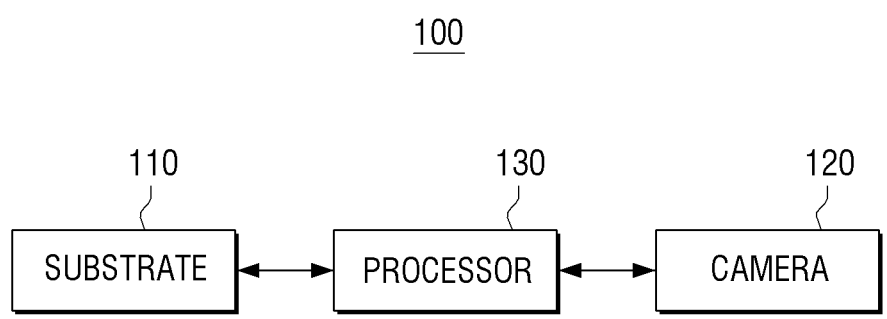
FIG. 2 is a block diagram to explain simple configuration of an electronic apparatus according to an embodiment of the disclosure.

FIG. 2 is a block diagram to explain simple configuration of an electronic apparatus according to an embodiment of the disclosure.

Referring to FIG. 2, an electronic apparatus 100 may include a substrate 110, a camera 120, and a processor 130.

The electronic apparatus 100 may obtain characteristic of each of a plurality of micro LEDs disposed on a transparent substrate. The electronic apparatus 100 may arrange each of the plurality of micro LEDs on a target substrate based on the characteristic information. The plurality of micro LEDs may be disposed on the target substrate, and physically connected to the substrate. The target substrate may be a typical print circuit board, and may have various shapes to be applied to display products.

The substrate 110 may include a plurality of electrodes to apply a current to part of a plurality of micro LEDs by contacting at least part of the electrodes of the plurality of micro LEDs disposed on the transparent substrate. The plurality of micro LEDs may be disposed on the transparent substrate at the interval of one pitch. The plurality of electrodes on the substrate 110 may apply a current to micro LEDs disposed at the second pitch that is a multiple of the first pitch of the plurality of micro LEDs, and the multiple can be a natural number.

The second pitch may be determined based on the performance of the camera 120. The second pitch may be in proportion to resolving power of the camera. The resolving power may refer to a shortest distance to distinguish two adjacent points. When the resolving power is large, the shortest distance to distinguish the two points may be small, which means that the performance of the camera 120 is good. When the resolving power is large, the shortest distance to distinguish the two points may be small, and it is possible to identify individual performance even if the two micro LEDs at the shorter distance emit light. Therefore, when the resolving power of the camera 120 is large, the size of the second pitch may get smaller.

When the resolving power of the camera 120 is small, it may be difficult to identify individual performance by interference as two micro LEDs emit light. In this case, a current may be applied through the electrodes of the substrate 110 so that two micro LEDs in a greater distance may emit light by extending the second pitch. This can be set by user setting, or automatically set by the electronic apparatus 100.

According to various embodiments, the electronic apparatus 100 may apply a current to micro LEDs at the second pitch. The electrodes may be disposed on the substrate 110 at an interval of the second pitch. In this case, the electronic apparatus 100 may apply a current to all electrodes so that a current may be applied to the micro LEDs at the second pitch. In this case, the second pitch may be a multiple of the first pitch, and when the first micro LED emits light, the second micro LED adjacent thereto may not emit light, and the third micro LED may emit light.

When it is difficult to identify individual performance of each micro LED although a micro LED emits light by applying a current to electrodes disposed on the second pitch that is a multiple of the first pitch, the electronic apparatus 100 may apply a current to the electrodes at the interval of four times the first pitch by extending the second pitch. In this case, when the first micro LED emits light, the second and third micro LEDs adjacent thereto may not emit light, and the fourth micro LED may emit light.

The electrodes may be disposed on the substrate 110 at the interval of the first pitch. The electronic apparatus 100 may apply a current to electrodes at the interval of the second pitch, not all electrodes on the substrate 110. Accordingly, a current may be applied only to micro LEDs at the interval of the second pitch. The second pitch may be controlled by the resolving power of the camera 120, and the detailed description thereof will be made with reference to FIG. 6.

The camera 120 may capture an image of a plurality of micro LEDs disposed on a transparent substrate. The camera 120 may be disposed opposite to the substrate 110 based on a transparent substrate, and capture an image of the plurality of micro LEDs including the micro LED which emits light. The camera 120 may capture light of the light-emitting micro LED with the transparent substrate interposed therebetween. The camera 120 may transmit data obtained by capturing the light to the processor 130.

The processor 130 may be provided in the electronic apparatus 100 to control the overall operations and functions of the electronic apparatus 100. The processor 130 may include at least one of a central processing unit (CPU), a controller, an application processor (AP), a communication processor (CP), an ARM processor, etc.

The processor 130 may be electrically connected to the substrate 110 to apply a current to micro LEDs through a plurality of electrodes disposed on the substrate 110. The plurality of electrodes disposed on the substrate 110 may be controlled individually, and the processor 130 may apply a current to part of the plurality of electrodes on the substrate 110.

The processor 130 may be electrically connected to the camera 120 to control the camera 120 to capture an image of a plurality of micro LEDs disposed on the transparent substrate. The plurality of micro LEDs may include the micro LED which emits light by the current applied through the electrodes disposed on the substrate 110.

The processor 130 may receive data captured by the camera 120, and obtain characteristic information of the light-emitting micro LED based on the received data. The data received from the camera 120 may be an image captured by the camera 120.

The processor 130 may obtain characteristic information of the light-emitting micro LED based on the received data. The processor 130 may obtain a luminance value, and a color coordinate value of the light-emitting micro LED by analyzing light of the light-emitting micro LED, and determine the performance grade of the micro LED based on the luminance value and the color coordinate value.

The color coordinate value may relate to a wavelength output from the micro LED, and the colors emitted by the micro LED may vary depending on the output wavelengths.

For example, when the micro LED emits light of wavelengths approximately between 630 nm and 780 nm, the color may be red, when the micro LED emits light of wavelengths approximately between 520 nm and 570 nm, the color may be green, and when the micro LED emits light of wavelengths approximately between 420 nm and 480 nm, the color may be blue.

When the micro LED that emits green light of wavelengths between 520 nm and 570 nm is disposed on the transparent substrate, the wavelength of approximately 520 nm may be light of cyan color, and the wavelength of approximately 570 nm may be light of yellow green.

Therefore, the characteristic of the micro LED may vary depending on the wavelength emitted from the micro LED.

The luminance may indicate the brightness of a light source having a predetermined range, and the brightness indicated by the plurality of micro LEDs may vary depending on the luminance of the micro LEDs on the transparent substrate.

The criteria for classifying the performance grade on the micro LED may be set in advance. The performance grade may be classified based on such as the color coordinate value or the luminance of light emitted by the micro LED in terms of a specific basis, and the specific basis may vary depending on the needs of the user.

For example, when the performance grade is based on the output wavelength, the closer to the wavelength of the specific basis, the higher the performance grade, and the farther away from the wavelength of the specific basis, the lower the performance grade.

In addition, when the performance grade is based on the luminance, the higher the luminance, the higher the performance grade, and the lower luminance, the lower performance grade.

Both the output wavelength and the luminance according to predetermined criteria of a user may be considered for the performance grade. For example, the performance grade may be set by giving a weight U/100 to the output wavelength (hereinafter, U is a positive rational number of less than 100), and by giving a weight (100−U)/100 to the luminance according to the characteristic that is to be embodied in the micro LED by the user.

The processor 130 may identify the position of the micro LED contacting the electrodes of the substrate 110 on the transparent substrate by performing alignment of the electrodes of the substrate 110 and the electrodes of the micro LED before contacting. Accordingly, the processor 130 may match the position information with the obtained characteristic information of the light-emitting micro LED.

The processor 130 may repeatedly perform measurements of the light-emitting micro LED and the micro LED adjacent thereto by moving the substrate 110 or the transparent substrate on which the micro LED is disposed.

The processor 130 may determine a target substrate on which each of a plurality of micro LEDs is disposed based on the obtained characteristic information. The processor 130 may determine a target substrate on which each of the plurality of LEDs is disposed so that the micro LEDs having the similar characteristic are disposed on the same target substrate.

As described above, the absolute characteristic values of the plurality of micro LEDs disposed on the transparent substrate may be measured. According to an embodiment, it is possible to obtain characteristic information before separating the micro LED from the substrate, and manufacture an LED module having the uniform brightness and color using the characteristic information obtained without the classification process.

Figure 3:
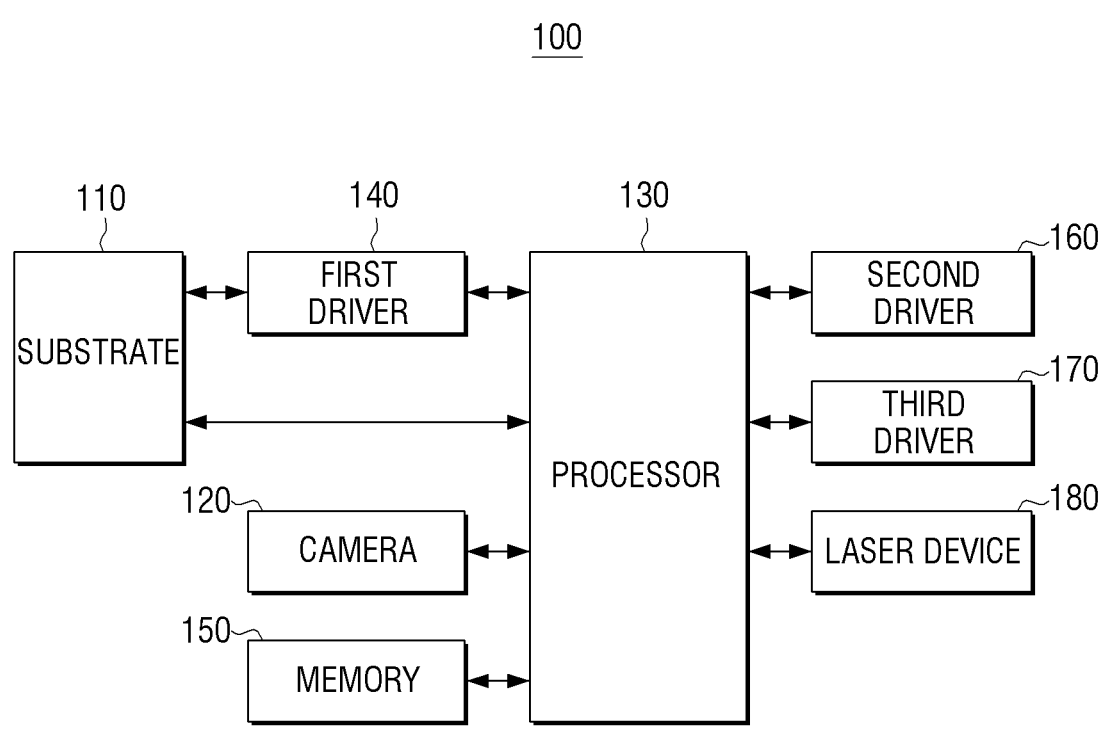
FIG. 3 is a block diagram to explain detailed configuration of an electronic apparatus of FIG. 2.

FIG. 3 is a block diagram to explain detailed configuration of an electronic apparatus of FIG. 2.

Referring to FIG. 3, an electronic apparatus 100 may include a substrate 110, a camera 120, a processor 130, a first driver 140, a memory 150, a second driver 160, a third driver 170, and a laser device 180.

Part of the operations of the substrate 110, the camera 120, and the processor 130 are the same as those of the configurations of FIG. 2, the repeated description will be omitted.

The first driver 140 may be electrically connected to the processor 130 to move the substrate 110 by the control of the processor 130. The processor 130 may capture an image of a plurality of micro LEDs including the light-emitting micro LED because of a current applied by the electrode of the substrate 110, and control the first driver 140 to move the substrate 110 for applying a current to the light-emitting micro LED and the micro LED adjacent thereto. The processor 130 may control the first driver 140 to move the substrate 110 by the first pitch which is the interval of the micro LED.

The memory 150 may be provided in the electronic apparatus 100 to store various programs, data, etc. For example, the memory 150 may be embodied as at least one of flash memory, a ROM, a RAM, a hard disk type, a multimedia card micro type, and a card type memory (e.g., SD, XD memory, etc.).

The memory 150 may be electrically connected to the processor 130 to transmit signals and information to the processor 130. Accordingly, characteristic information of a plurality of inputs or micro LEDs may be stored in the memory 150, and the stored characteristic information may be used by the processor 130.

The position information and the obtained characteristic information of the micro LEDs may be matched and stored in the memory 150. In addition, information on the target substrate determined for each micro LED may be stored based on the obtained characteristic information.

The second driver 160 may be electrically connected to the processor 130 to arrange the plurality of LEDs disposed on the transparent substrate on the target substrate by the control of the processor 130. The processor 130 may control the second driver 160 to arrange the micro LED having the characteristic information in the first range on the first target substrate, and the micro LED having the characteristic information in the second range on the second target substrate.

For example, the processor 130 may control the second driver 160 so that the micro LED having the first performance grade among the plurality of micro LEDs disposed on one substrate may be arranged on the first target substrate. The processor 130 may control the second driver 160 so that the micro LED having the second performance grade in a range different from that of the first performance grade may be disposed on a second target substrate different from the first target substrate.

The second driver 160 may optionally or collectively pick up the plurality of micro LEDs disposed on the transparent substrate. The second driver 160 may pick up the micro LEDs through various methods such as an adhesive method, a vacuum method, an electrostatic method, a hybrid method, or the like, if necessary. In this case, the second driver 160 may operate as a carrier.

When a micro LED on the transparent substrate is transferred onto a target substrate by using laser, the second driver 160 may move the transparent substrate itself on the target substrate. For arranging the micro LED on the target substrate selectively, the mask may be disposed on the transparent substrate. The mask may be disposed opposite to the surface of the transparent substrate on which the micro LED is disposed. The mask may include a plurality of holes. The area in which the plurality of holes are formed on the mask may be an area in which the micro LED to be transferred onto the target substrate is disposed by laser irradiation.

The operation of arranging the mask on the transparent substrate may be performed by the third driver 170. The third driver 170 may be electrically connected to the processor 130, and may arrange the mask on the transparent substrate by the control of the processor 130.

For example, when the micro LED having the first performance grade is transferred onto the first target substrate, the processor 130 may control the third driver 170 so that the mask formed with holes may be disposed where the micro LED having the first performance grade is arranged on the transparent substrate. When the micro LED having the second performance grade is transferred onto the second target substrate, the processor 130 may control the third driver 170 so that the mask formed with holes may be disposed where the micro LED having the second performance grade is arranged on the transparent substrate.

The mask arrangement operation may be performed before or after the transparent substrate is moved onto the target substrate by the second driver 160.

The laser device 180 may be electrically connected to the processor 130 to irradiate laser on the transparent substrate by the control of the processor 130. The laser may render the micro LED to be separated and disposed on the target substrate. The mask may be formed on the transparent substrate so that the micro LED may be selectively separated.

Meanwhile, the disclosure is not limited thereto, but a process of aligning the micro LEDs on an additional substrate may be added for collectively arranging the micro LEDs on the target substrate.

Although not shown in FIG. 3, according to an embodiment, the electronic apparatus may further include a driver for moving a transparent substrate to contact the electrode of the substrate 110, and a driver for moving the transparent substrate by the first pitch for measuring the adjacent micro LED.

Figure 4:
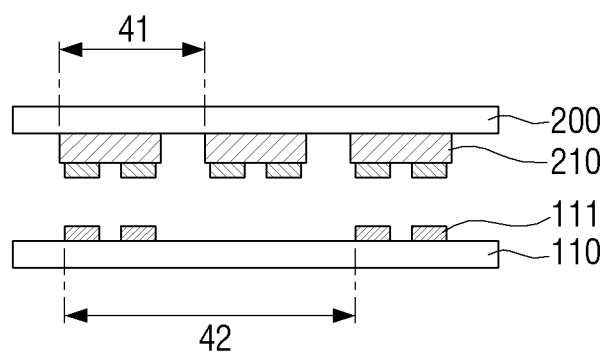
FIG. 4 is a view to explain a method for measuring a micro LED according to an embodiment of the disclosure.

FIG. 4 is a view to explain a method for measuring a micro LED according to an embodiment of the disclosure.

Referring to FIG. 4, a plurality of micro LEDs 210 may be disposed on a transparent substrate 200 at the interval of a first pitch 41. The first pitch 41 may be an interval between micro LEDs, and also it may be an interval between the same points of two adjacent micro LEDs.

For example, referring to FIG. 4, the distance between the left and right sides of two micro LEDs is defined as the first pitch 41. However, the distance between the corresponding points, such as the center points of the micro LEDs, may be defined as the first pitch.

A plurality of electrodes 111 for applying a current to the plurality of micro LEDs 210 may be disposed at the interval of a second pitch 42. The second pitch 42 may be a multiple of the first pitch 41, and the multiple may be a natural number.

For ease of explanation, FIG. 4 illustrates that the second pitch 42 is a multiple of the first pitch 41, but in the implementation, the multiple may be one or three times depending on the function of the camera and the intensity of light of the micro LED.

The size of the micro LED 210 may be between 30 μm and 100 μm. The size may be the length of one side of the micro LED.

The second pitch 42, which is the interval between the electrodes 111 on the substrate 200, may be the same as the pitch 41, or more than the multiple of the first pitch 41. The second pitch 42 may be between 100 μm and 200 μm. The second pitch 42 may vary depend on the size of the micro LED 210, the interval between the micro LEDs 210, the camera function, and the like.

Figure 5:
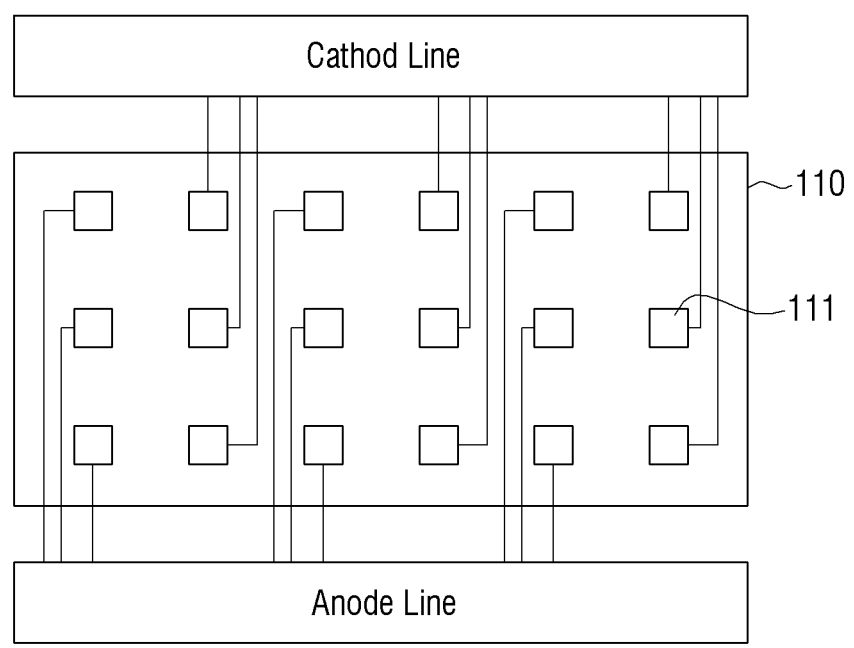
FIG. 5 is a view to explain an arrangement of electrodes according to an embodiment of the disclosure.

FIG. 5 is a view to explain an arrangement of electrodes according to an embodiment of the disclosure. FIG. 5 is a top-view illustrating a partial area of a substrate on which electrodes for applying a current to a micro LED are disposed.

Referring to FIG. 5, the substrate 110 may include a plurality of electrodes 111 arranged in a row. The plurality of electrodes 111 may apply a current to the micro LED in contact with part of the electrodes of the plurality of micro LEDs disposed on the transparent substrate.

The plurality of electrodes disposed on the substrate 110 may include a set of an anode electrode and a cathode electrode, and the set of the electrodes may be disposed at a predetermined interval.

Each of the electrodes 111 may be controlled by a processor individually. For example, when the set of a plurality of electrodes is disposed at the same interval as the plurality of micro LEDs disposed on the transparent substrate, a current may be applied to all electrodes on the substrate 110 by the control of the processor, or to part of the electrodes.

The number of times of measurements may be reduced by applying a current to the most adjacent micro LED in a range where light of the micro LED output according to current applying is not mixed or interfered with each other. In addition, an optimal pitch may be easily derived by gradually increasing a pitch to which a current is applied.

Figure 6:
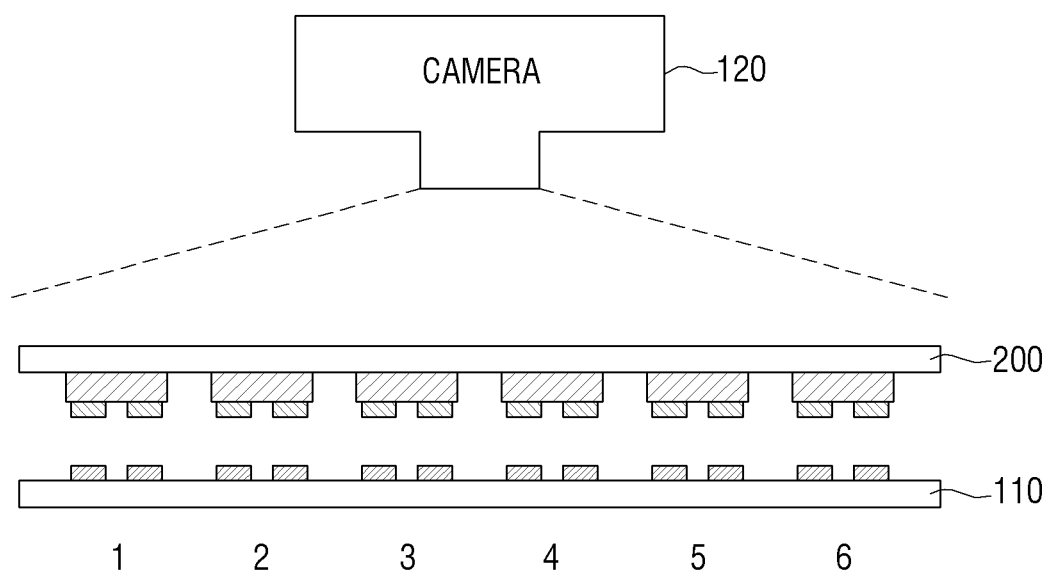
FIG. 6 is a view to explain a method for measuring a micro LED according to another embodiment of the disclosure.

FIG. 6 is a view to explain a method for measuring a micro LED according to another embodiment of the disclosure. FIG. 1 illustrates that the electrodes are disposed on the substrate at the second pitch which is the multiple of the first pitch of the micro LED, but FIG. 6 illustrates that the electrodes are disposed on the substrate at the first pitch.

The electronic apparatus may make the electrodes disposed on the substrate 110 be in contact with the electrodes of the micro LEDs disposed on the transparent substrate 200. The electronic apparatus may apply a current to electrodes 1 to 6 on the substrate 110 so that all the micro LEDs may emit light.

The electronic apparatus may control the camera 120 to capture light emitted from the micro LEDs, and measure the characteristic of the light-emitting micro LED by analyzing the captured image. If the performance grade of the camera 120 is high, output light of the adjacent micro LED is distinguished, and interference of the output light does not occur to allow to measure the characteristic, the electronic apparatus may perform a measurement process only once to measure all micro LEDs disposed on the transparent substrate 200.

When the interval between the light-emitting micro LEDs is too small, so that the interference of light occurs, or when the performance grade of the camera 120 is low, so that light emitted from the adjacent micro LED is not distinguished, the electronic apparatus may control the electrodes of the substrate 110 to apply a current at a greater pitch.

The electronic apparatus may apply a current to the micro LEDs at the pitch that is a multiple of the pitch of the micro LEDs. For example, the electronic apparatus may apply a current to electrodes 1, 3 and 5 among the electrodes on the substrate 110, and allow only the micro LEDs contacting electrodes 1, 3 and 5 to emit light.

The electronic apparatus may control the camera 120 to capture light emitted from the micro LEDs, analyze the captured image, and measure the characteristic of the light-emitting micro LEDs. When it becomes possible to measure the characteristic because the output light of the micro LEDs contacting electrode nos. 1, 3 and 5 is distinguished and the interference of the output light does not occur, the electronic apparatus may measure the micro LEDs contacting the electrode nos. 1, 3 and 5, and then perform the operation of measuring the adjacent micro LED. The electronic apparatus may maintain the position of the substrate 110, and apply a current to electrodes nos. 2, 4, and 6, or apply a current to electrodes nos. 1, 3, and 5 after moving the substrate 110 by the pitch of the micro LEDs. The electronic apparatus may perform a measurement process for four times in total to measure all the micro LEDs disposed on the transparent substrate 200. The sequence of the measuring process will be described in detail with reference to FIG. 7.

When the interference of light of the light-emitting micro LED still occurs, or the light emitted from the adjacent micro LED is not distinguished, the electronic apparatus may control the electrodes on the substrate 110 to apply a current at a larger pitch.

To be specific, the electronic apparatus may apply a current to the micro LEDs at the pitch that is a triple of the pitch of the micro LEDs. For example, the electronic apparatus may apply a current only to electrode nos. 1, 4, and 7 (not shown) on the substrate 110, so that only the micro LEDs contacting the electrodes nos. 1, 4 and 7 (not shown) may emit light.

The electronic apparatus may control the camera 120 to capture light emitted from the micro LEDs, analyze the captured image, and measure the characteristic of the light-emitting micro LEDs. When it becomes possible to measure the characteristic because the output light of the micro LEDs contacting electrode nos. 1, 4 and 7 (not shown) is distinguished and interference of the output light does not occur, the electronic apparatus may measure the micro LEDs contacting the electrode nos. 1, 4 and 7, and perform the operation of measuring the adjacent micro LEDs. The electronic apparatus 110 may maintain the position of the substrate 110, and apply a current to electrodes nos. 2, 5 and 8 (not shown), or apply a current to the electrode nos. 1, 4, and 7 (not shown) after moving the substrate 110 by the pitch of the micro LEDs. In this case, the electronic apparatus may perform a measurement process for nine times in total to measure all the micro LEDs disposed on the transparent substrate 200. The sequence of the measuring process will be described in detail with reference to FIG. 7.

As described above, a minimum pitch capable of measuring output light of the light-emitting micro LED may be obtained by extending a pitch to which a current is applied.

Figure 7:
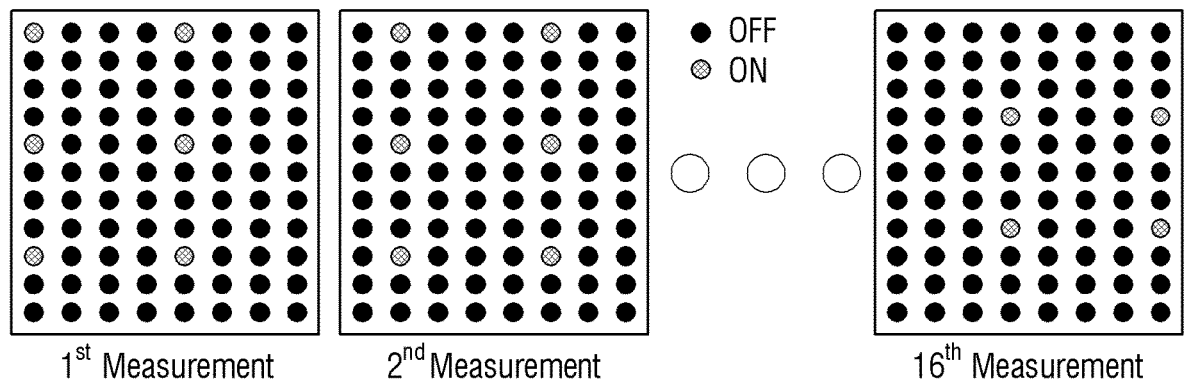
FIG. 7 is a view to explain a sequence of measuring a micro LED according to an embodiment of the disclosure.

FIG. 7 is a view to explain a sequence of measuring a micro LED according to an embodiment of the disclosure. FIG. 7 illustrates a light-emitting micro LED according to the current applying, or the data obtained from capturing the micro LED.

Referring to FIG. 7, the electronic apparatus may set the second pitch to which a current is applied to be four times the first pitch on which the micro LEDs are disposed. In this case, the electronic apparatus may perform a measuring process 16 times in total. However, the second pitch shown in FIG. 7 is only an embodiment, but may vary depending on the resolving power of the camera. For ease of explanation, it is assumed that the position of the micro LED at the leftmost and topmost row of the micro LED is (1,1).

The electronic apparatus may apply a current only to the micro LEDs disposed at (1,1), (1,4), (4,1), (4,4), (8,1) and (8,4) to emit light in the 1st measurement.

After capturing, the electronic apparatus may perform the 2nd measurement by moving the substrate to the right by the first pitch, and apply a current to the right electrode of the electrode to which a current is applied as shown in FIG. 6. The direction is not limited to the right, but it can be any one of upper, lower, left and right directions.

For example, in the 2nd measurement, the electronic apparatus may apply a current only to the micro LEDs disposed at (1,2), (1,5), (4,2), (4,5), (8,2) and (8,5) to emit light such that the micro LEDs adjacent to the right side of the light-emitting micro LEDs in the first measurement may emit light.

After capturing, the measurement of the adjacent micro LEDs may be repeatedly performed by moving the substrate or applying a current to another electrode. The electronic apparatus may complete the measurement operation at the 16th measurement. For example, in the 16th measurement, the electronic apparatus may apply a current only to the micro LEDs disposed at (4,4), (8,4), (8,4) and (8,8) to capture the micro LEDs.

As described above, the electronic apparatus may apply a current to the micro LEDs at a predetermined interval, capture, and analyze the micro LEDs, and obtain characteristic information of each of the micro LEDs disposed on the transparent substrate.

Figure 8:
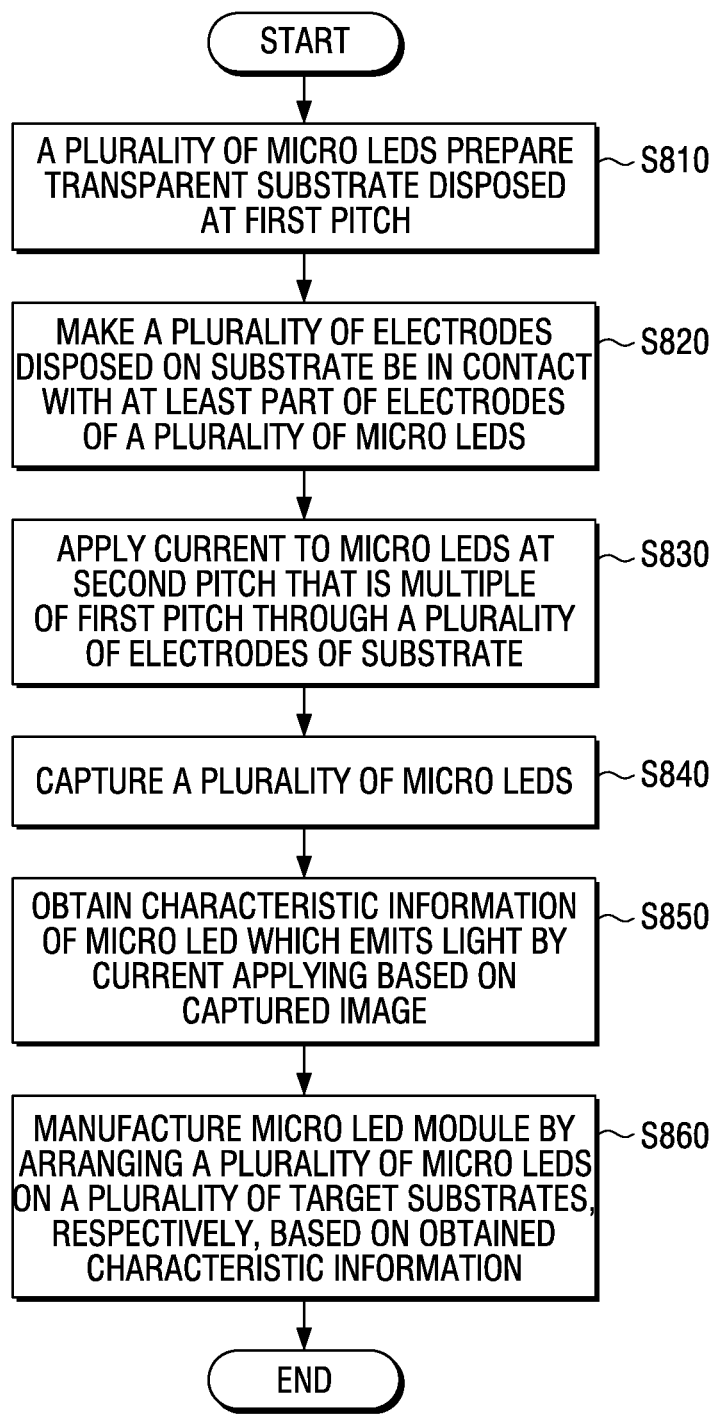
FIG. 8 is a flowchart to explain a method for manufacturing a micro LED module according to an embodiment of the disclosure.

FIG. 8 is a flowchart to explain a method for manufacturing a micro LED module according to an embodiment of the disclosure.

Referring to FIG. 8, the electronic apparatus may prepare a transparent substrate on which a plurality of micro LEDs are disposed at the first pitch at step S810. The transparent substrate may be a wafer in which the micro LEDs are initially generated, or a relay substrate formed by moving the micro LEDs generated in the wafer.

The electronic apparatus may make a plurality of electrodes disposed on a substrate be in contact with at least part of electrodes of the plurality of micro LEDs at step S820. The plurality of electrodes may be disposed at the second pitch that is a multiple of the first pitch of the micro LED. The plurality of electrodes on the substrate may contact part of the electrodes of the plurality of micro LEDs. For another embodiment, the plurality of electrodes may be disposed on the substrate at the first pitch of the micro LEDs. In this case, the plurality of electrodes on the substrate may contact the entirety of the electrodes of the plurality of micro LEDs.

The electronic apparatus may apply a current to the micro LEDs at the second pitch that is a multiple of the first pitch through the plurality of electrodes on the substrate at step S830. The electronic apparatus may apply a current to the micro LEDs at the interval where light is distinguished according to the camera performance, and the light of the light-emitting micro LED is not interfered. The plurality of electrodes on the substrate may be controlled individually, and the electronic apparatus may apply a current to at least part of the plurality of electrodes on the substrate.

The electronic apparatus may capture an image of a plurality of micro LEDs S840. The electronic apparatus may capture an image of the plurality of micro LEDs by using the provided camera. The plurality of micro LEDs may include the micro LED which emits light by the current applying.

The electronic apparatus may obtain characteristic information of the micro LED which emits light by the current applying, based on the captured image at step S850. The electronic apparatus may obtain at least one of a luminance value, a color coordinate value, a performance grade of the light-emitting micro LED based on the captured image.

The electronic apparatus may manufacture a micro LED module by arranging the plurality of micro LEDs on the plurality of target substrates, respectively, based on the obtained characteristic information at step S860. The electronic apparatus may determine a target substrate on which each of the plurality of micro LEDs is disposed based on the obtained characteristic information. To be specific, the electronic apparatus may determine the micro LEDs having the similar characteristic information to be disposed on the same target substrate. The electronic apparatus may manufacture a micro LED module by arranging each micro LED on the determined target substrate.

According to the above-described embodiment, a micro LED module that emits light uniformly may be manufactured by using micro LEDs having the similar characteristic information.

Figure 9:
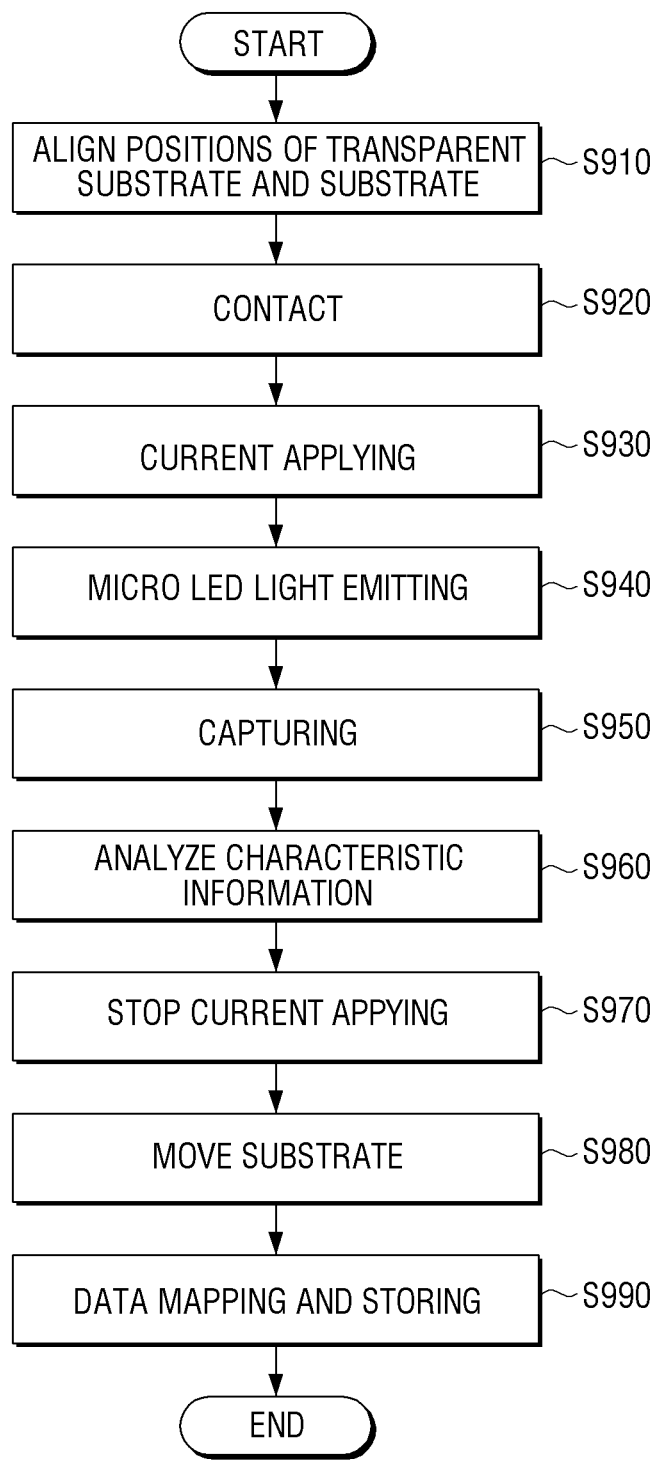
FIG. 9 is a flowchart to explain a method for measuring a micro LED in detail according to an embodiment of the disclosure.

FIG. 9 is a flowchart to explain a method for measuring a micro LED in detail according to an embodiment of the disclosure.

Referring to FIG. 9, the electronic apparatus may align the positions of the transparent substrate and the substrate at step S910. A plurality of micro LEDs may be disposed on the transparent substrate, and electrodes for applying a current to the micro LEDs may be disposed on the substrate.

The electronic apparatus may align the positions of a plurality of electrodes disposed on the substrate and electrodes of the plurality of micro LEDs disposed on the transparent substrate by controlling X-axis, Y-axis, Z-axis and angle (θ).

The electronic apparatus may make the electrodes of the plurality of LEDs disposed on the transparent substrate be in contact with the plurality of electrodes disposed on the substrate at step S920. The electrodes on the substrate may contact all or part of the electrodes of the plurality of micro LEDs according to the arrangement form of the electrodes disposed on the substrate.

The electronic apparatus may apply a current through electrodes disposed on the substrate at step S930. The electronic apparatus may apply a current through at least part of the plurality of electrodes disposed on the substrate. When a current is applied to part of the plurality of electrodes disposed on the substrate, a current may be applied to electrodes at a predetermined interval. The predetermined interval may be a multiple of the interval of the arrangement of the micro LEDs.

As a current is applied, a micro LED to which a current is applied may emit light at step S940. Depending on the electrodes to which a current is applied, the micro LED adjacent to the light-emitting micro LED may not emit light.

The electronic apparatus may capture an image of a plurality of micro LEDs at step S950. The electronic apparatus may capture an image of the plurality of micro LEDs disposed on the transparent substrate using the camera provided in the electronic apparatus. The plurality of micro LEDs may include the micro LED which emits light by the current applying.

The electronic apparatus may analyze the characteristic information of the light-emitting micro LED using the captured data at step S960. The captured data may refer to the captured image, and the electronic apparatus may analyze the captured image, and obtain at least one of a luminance value, a color coordinate value, a performance grade, etc. of the light-emitting micro LED.

After capturing, the electronic apparatus may stop applying a current through the electrodes of the substrate at step S970, and move the substrate at step S980. The substrate may move to apply a current to the micro LED adjacent to the light-emitting micro LED according to the current applying.

The electronic apparatus may return to step S920, and repeatedly perform the operations of contact, current applying, capturing, analyzing, current apply stopping and substrate moving.

The electronic apparatus may map the position with the obtained characteristic information of the light-emitting micro LED and store the information at step S990. FIG. 9 illustrates that the mapping and storing are performed after the measuring process, but in the implementation, the electronic apparatus may obtain the characteristic information first, map and store the position information with the characteristic information of the micro LED, and move the substrate.

FIG. 10 is a view to explain an example for manufacturing a micro LED module using characteristic information of a micro LED.

Referring to FIG. 10, as a result of measuring operation of the electronic apparatus, characteristic information on each of a plurality of micro LEDs 210 disposed on the transparent substrate 200 may be obtained. For ease of explanation, referring to FIG. 10, it is assumed that the performance grade of each micro LED is classified as A1, A2, A3, and so on.

The electronic apparatus may determine target substrates 500-1, and 500-2 of each micro LED based on the characteristic information of the obtained micro LED, and arrange each micro LED on the determined target substrates 500-1, and 500-2.

For example, the electronic apparatus may arrange the micro LEDs of grade A1 on the first target substrate 500-1, and the micro LEDs of grade A2, which is different from A1, on the second target substrate 500-2, which is a different target substrate. According to setting, the micro LEDs of grad A1 and grade A2 may be arranged on the first target substrate 500-1.

As described above, it becomes possible to manufacture a LED module having a uniform output characteristic by using micro LEDs having the similar characteristic information according to the characteristic information of each micro LED.

Figure 11:
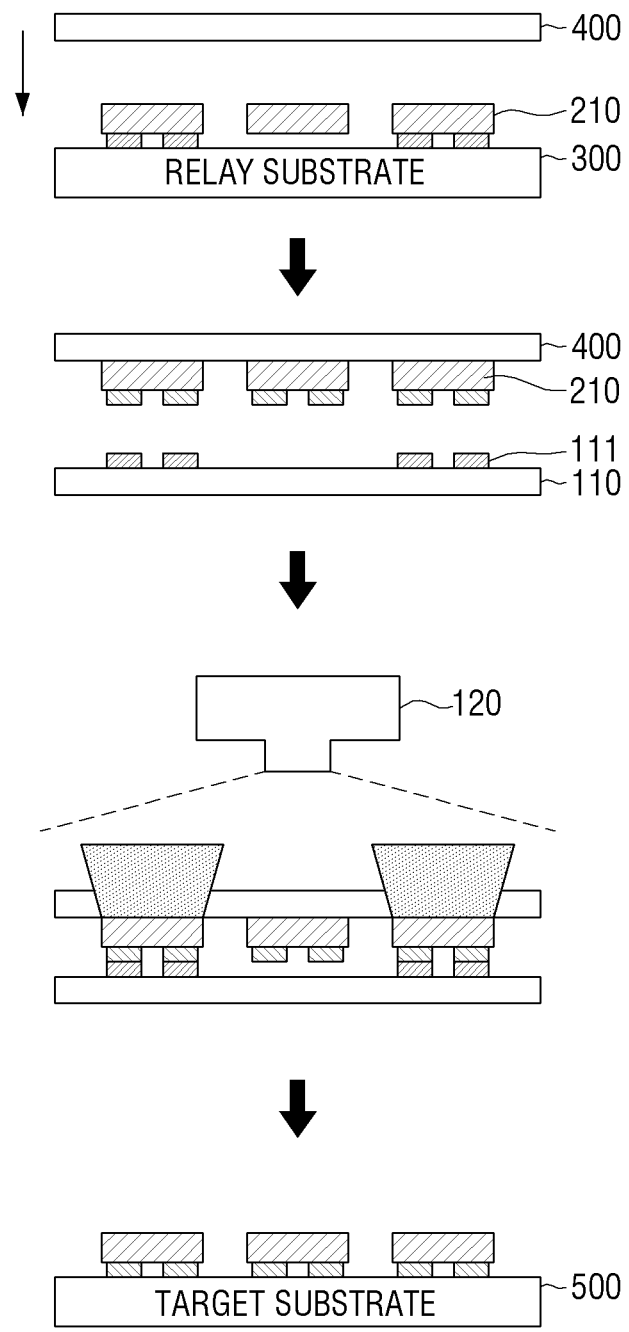
FIG. 11 and FIG. 12 are views to explain various methods for measuring a micro LED.
Figure 12:
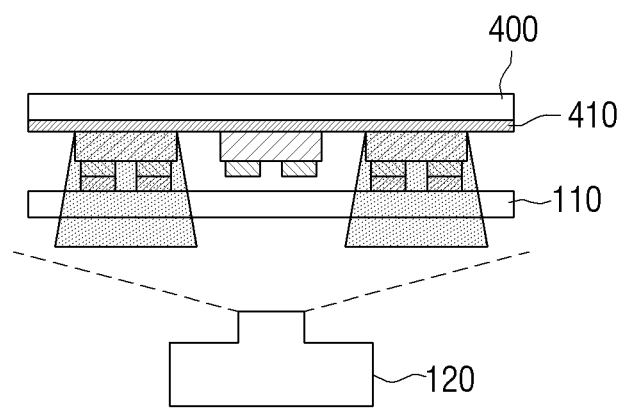

FIG. 11 and FIG. 12 are views to explain various methods for measuring a micro LED. FIG. 11 and FIG. 12 illustrate that micro LEDs are disposed on a relay substrate, not on a wafer, and then measured.

Referring to FIG. 11, a plurality of micro LEDs 210 may be disposed on a relay substrate 300 to perform a measurement according to an embodiment. The electrode surface of the plurality of micro LEDs 210 may contact the relay substrate 300.

For measurement, the electronic apparatus may attach a carrier 400 to the light emitting surfaces of the micro LEDs 210 to pick up the micro LEDs and separate the plurality of micro LEDs 210 from the relay substrate 300. The carrier 400 may pick up a micro LED using various methods such as adhesion method, vacuum method, electrostatic method, hybrid method, etc. The carrier 400 may be a transparent substrate.

As the carrier 400 separates the plurality of micro LEDs 210 from the relay substrate 300, the electrode substrate may be exposed, so that the characteristic information of the plurality of micro LEDs may be obtained by using a measurement method according to an embodiment.

The electronic apparatus may arrange the substrate 110 on which the plurality of electrodes 111 are disposed under the plurality of micro LEDs 210, and make at least part of the electrodes of the plurality of micro LEDs 210 be in contact with the electrodes 111 disposed on the substrate 110.

In addition, when a current is applied to the electrode 111, and the micro LEDs 210 emit light, the electronic apparatus may capture an image of the micro LEDs by using the camera 120. The camera 120 may be disposed opposite to the micro LEDs 210 based on the carrier 400, which is a transparent substrate. The electronic apparatus may obtain the characteristic information of the light-emitting micro LED using the captured image.

The micro LEDs may be disposed on the target substrate 500 determined based on the characteristic information of each micro LED.

FIG. 11 illustrates that the carrier 400 is a transparent substrate, but it may be a substrate including a reflective surface 410 as shown in FIG. 12. The carrier 400 may not be a transparent substrate.

When the micro LEDs emit light according to the current applying, all light may be reflected onto the reflective surface 410. Referring to FIG. 12, when all of light emitted from the micro LEDs is reflected, the camera 120 may be disposed in a direction where the micro LEDs are disposed based on the carrier 400, or in an opposite direction to a surface where the plurality of electrodes are disposed based on the substrate 110 including a plurality of electrodes.

The reflective light may transmit through the substrate including the electrodes to be captured by the camera 120, and thus the substrate 110 including the electrodes may be a transparent substrate.

FIG. 12 illustrates that the reflective surface 410 is disposed on a surface where the micro LEDs are in contact with the carrier 400, but according to an embodiment, when the carrier 400 is a transparent substrate, the reflective surface 410 may be disposed on the surface of the carrier 400 that is not in contact with the micro LED. In this case, the light output from the micro LEDs may transmit through the carrier 400, be reflected from the reflective surface 410, and then transmit through the carrier 400. Therefore, the light that transmits through the substrate 110 may be captured by the camera 120.

As described above, according to various embodiments of the disclosure, absolute characteristic values of a plurality of micro LEDs on a substrate may be measured. In addition, it becomes possible to manufacture an LED module having a uniform brightness and color using the obtained characteristic information without a classification process because characteristic information before micro LED separation can be obtained.

Meanwhile, the various embodiments described above can be implemented using software, hardware, or a combination thereof. According to a hardware implementation, the embodiments described in this disclosure may be implemented as application specific integrated circuits (ASICs), digital signal processors (DSPs), digital signal processing devices (DSPDs), programmable logic devices (PLDs) programmable gate arrays, a processor, a controller, a microcontroller, a microprocessor, and an electrical unit for performing other functions. In some cases, example embodiments in this specification may be embodied as the processor 130 itself. According to software implementation, embodiments such as the procedures and functions described herein may be implemented in separate software modules. Each of the software modules may perform one or more of the functions and operations described herein.

Meanwhile, the method according to various embodiments of the disclosure described above may be stored in a non-transitory computer readable medium. Such non-transitory computer readable media can be mounted and used in various devices.

The non-transitory computer readable medium refers to a medium that stores data semi-permanently rather than storing data for a very short time, such as a register, a cache, and a memory, and is readable by an apparatus. Specifically, the above-described various applications or programs may be stored in a non-transitory computer readable medium such as a compact disc (CD), a digital versatile disk (DVD), a hard disk, a Blu-ray disk, a universal serial bus (USB) memory stick, a memory card, and a read only memory (ROM), and may be provided.

According to an embodiment, the method according to various embodiments disclosed herein may be provided in a computer program product. A computer program product may be traded between a seller and a purchaser as a commodity. A computer program product may be distributed in the form of a machine-readable storage medium (e.g., compact disc read only memory (CD-ROM)) or distributed online through an application store (e.g., PlayStore™). In the case of on-line distribution, at least a portion of the computer program product may be temporarily stored, or temporarily created, on a storage medium such as a manufacturer's server, a server of an application store, or a memory of a relay server.

Although embodiments have been shown and described, it will be appreciated by those skilled in the art that changes may be made to these embodiments without departing from the principles and spirit of the disclosure. Accordingly, the scope of the invention is not construed as being limited to the described embodiments, but is defined by the appended claims as well as equivalents thereto.

What is claimed is:

1. An electronic apparatus comprising:
a substrate including a plurality of electrodes in contact with at least part of electrodes of a plurality of micro LEDs disposed on a transparent substrate at a first pitch to apply a current to micro LEDs of the plurality of micro LEDs disposed at a second pitch that is a multiple of the first pitch;
a camera disposed opposite to the substrate based on the transparent substrate; and
a processor configured to:
apply a current to the plurality of electrodes on the substrate,
control the camera to capture an image of the plurality of LEDs including a micro LED which emits light by the current applying,
obtain characteristic information of the light-emitting micro LED based on the captured image, and
determine a target substrate on which each of the plurality of micro LEDs is disposed based on the obtained characteristic information.

2. The electronic apparatus as claimed in claim 1, further comprising:
a first driver configured to move the substrate,
wherein the processor is further configured to move the substrate by the first pitch by controlling the first driver to apply a current to a micro LED adjacent to the light-emitting micro LED after capturing the image of the plurality of LEDs including the light-emitting micro LED.

3. The electronic apparatus as claimed in claim 1, further comprising:
a second driver configured to arrange each of the plurality of micro LEDs on the determined target substrate,
wherein the characteristic information includes at least one of a luminance value, a color coordinate value, and a performance grade of the light-emitting micro LED, and
wherein the processor is further configured to control the second driver to arrange a micro LED having a characteristic information value of a first range on a first target plate, and a micro LED having a characteristic information value of a second range that is different from the first range on a second target plate.

4. The electronic apparatus as claimed in claim 1, wherein a plurality of electrodes are disposed on the substrate at the second pitch.

5. The electronic apparatus as claimed in claim 1, wherein a plurality of electrodes are disposed on the substrate at the first pitch, and
wherein the processor is further configured to apply a current through a plurality of electrodes at a second pitch that is a multiple of the first pitch.

6. The electronic apparatus as claimed in claim 1, further comprising:
a memory,
wherein the processor is further configured to match position information with characteristic information of the light-emitting micro LED and store the matched information in the memory.

7. The electronic apparatus as claimed in claim 1, further comprising:
a laser device; and
a third driver configured to arrange a mask,
wherein the processor is further configured to:
control the third driver to arrange a mask including a plurality of holes on an opposite surface to a surface of the transparent substrate on which the plurality of micro LEDs are disposed, based on the obtained characteristic information, and
control the laser device to arrange a micro LED arranged in an area of the plurality of holes on the target substrate by irradiating laser onto the mask.

8. The electronic apparatus as claimed in claim 1, wherein the second pitch is in proportion to resolving power of the camera.

9. The electronic apparatus as claimed in claim 1, wherein a size of each micro LED of the plurality of micro LEDs is between 30 μm and 100 μm.

10. The electronic apparatus as claimed in claim 1, wherein the second pitch is between 100 μm and 200 μm.

11. A method for manufacturing a micro LED module, the method comprising:
preparing a transparent substrate on which a plurality of micro LEDs are arranged at a first pitch;

making a plurality of electrodes disposed on a substrate be in contact with at least part of electrodes of the plurality of micro LEDs;

applying a current to micro LEDs of the plurality of micro LEDs disposed at a second pitch that is a multiple of the first pitch through the plurality of electrodes on the substrate;

capturing an image of the plurality of micro LEDs;

obtaining characteristic information of a micro LED which emits light by the current applying based on the captured image; and manufacturing a micro LED module by arranging the plurality of micro LEDs on a plurality of target substrates based on the obtained characteristic information.

12. The method as claimed in claim 11, further comprising:

moving the transparent substrate or the substrate by the first pitch to apply a current to a micro LED adjacent to the light-emitting micro LED after capturing the image of the plurality of micro LEDs including the light-emitting micro LED.

13. The method as claimed in claim 11, wherein the characteristic information includes at least one of a luminance value, a color coordinate value, or a performance grade of the light-emitting micro LED, and wherein the method further comprises arranging a micro LED having a characteristic information value of a first range on a first target substrate, and a micro LED having a characteristic information value of a second range that is different from the first range on a second target substrate.

14. The method as claimed in claim 11, wherein a plurality of electrodes are disposed on the substrate at the second pitch.

15. The method as claimed in claim 11, wherein a plurality of electrodes are disposed on the substrate at the first pitch, and wherein the applying of the current comprises applying a current through a plurality of electrodes disposed at a second pitch that is a multiple of the first pitch.

16. The method as claimed in claim 11, further comprising:

matching position information with characteristic information of the light-emitting micro LED and storing the matched information.

17. The method as claimed in claim 11, wherein the manufacturing of the micro LED module comprises:

arranging a mask including a plurality of holes on an opposite surface to a surface of the transparent substrate on which the plurality of micro LEDs are disposed, based on the obtained characteristic information; and irradiating laser onto the mask to arrange a micro LED disposed in an area of the plurality of holes on the target substrate.

18. The method as claimed in claim 11, wherein a size of each micro LED of the plurality of micro LEDs is between 30 μm to 100 μm.

19. The method as claimed in claim 11, wherein the second pitch is between 100 μm to 200 μm.

20. A non-transitory computer-readable recording medium including a program for executing a manufacturing method of a micro LED module, wherein the manufacturing of the micro LED module comprises:

transmitting a control signal to a first driver for moving a substrate to make a plurality of electrodes disposed on the substrate be in contact with at least part of electrodes of a plurality of micro LEDs disposed on a transparent substrate at a first pitch;

applying a current to micro LEDs of the plurality of micro LEDs disposed at a second pitch that is a multiple of the first pitch through the plurality of electrodes on the substrate;

transmitting a control signal to a camera to capture an image of the plurality of micro LEDs;

obtaining characteristic information of a micro LED which emits light by the current applying based on the image captured by the camera; and transmitting a control signal to a second driver for arranging the plurality of micro LEDs on a plurality of target substrates based on the obtained characteristic information.

* * * * *